(12) United States Patent
Jeon et al.

(10) Patent No.: US 7,994,710 B2
(45) Date of Patent: Aug. 9, 2011

(54) ORGANIC LIGHT EMITTING DIODE DISPLAY

(75) Inventors: Hee-Chul Jeon, Yongin (KR); Soon-Ryong Park, Yongin (KR); Hee-Seong Jeong, Yongin (KR); Eun-Ah Kim, Yongin (KR); Woo-Suk Jung, Yongin (KR); Chul-Woo Jeong, Yongin (KR); Noh-Min Kwak, Yongin (KR); Joo-Hwa Lee, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 243 days.

(21) Appl. No.: 12/477,794

(22) Filed: Jun. 3, 2009

(65) Prior Publication Data

US 2010/0052518 A1 Mar. 4, 2010

(30) Foreign Application Priority Data

Aug. 28, 2008 (KR) ........................ 10-2008-0084505

(51) Int. Cl.
*H05B 33/00* (2006.01)
(52) U.S. Cl. .......................................... 313/504; 345/76
(58) Field of Classification Search .................. None
See application file for complete search history.

(56) References Cited

U.S. PATENT DOCUMENTS

| 7,619,357 | B2 * | 11/2009 | Onishi et al. ................... 313/506 |
| 2007/0024187 | A1 * | 2/2007 | Shin et al. ...................... 313/504 |
| 2007/0257602 | A1 * | 11/2007 | Miyagi et al. ................. 313/503 |
| 2009/0195148 | A1 * | 8/2009 | Lee et al. ...................... 313/504 |

FOREIGN PATENT DOCUMENTS

| KR | 10-2005-0000131 A | 1/2005 |
| KR | 10-2007-0032974 A | 3/2007 |
| KR | 10-0742374 | 7/2007 |

OTHER PUBLICATIONS

Korean Patent Abstracts (English Abstract), Publication No. 1020070065681, dated Jun. 25, 2007, corresponding to Korean Patent Registration noted above.

* cited by examiner

*Primary Examiner* — Ashok Patel
(74) *Attorney, Agent, or Firm* — Christie, Parker & Hale, LLP

(57) ABSTRACT

A pixel of an OLED display includes: a thin film transistor (TFT) including a gate electrode, a source electrode, and a drain electrode; a planarization layer on the TFT and including a contact hole at least partially exposing the drain electrode; a pixel electrode on the planarization layer and coupled to the drain electrode of the TFT through the contact hole; and an organic emission layer on the pixel electrode. The pixel electrode includes a corner-cube pattern facing the organic emission layer.

20 Claims, 7 Drawing Sheets

ORGANIC LIGHT EMITTING DIODE DISPLAY

CROSS-REFERENCE TO RELATED APPLICATION

This application claims priority to and the benefit of Korean Patent Application No. 10-2008-0084505 filed in the Korean Intellectual Property Office on Aug. 28, 2008, the entire contents of which are incorporated herein by reference.

BACKGROUND OF THE INVENTION

1. Field of the Invention

The present invention relates to an organic light emitting diode (OLED) display. More particularly, it relates to an OLED display having improved visibility.

2. Description of the Related Art

An OLED display includes a plurality of organic light emitting diodes (OLEDs) including hole injection electrodes, an organic light emission layer, and electron injection electrodes. Light is emitted by energy generated when excitons, generated when electrons and holes are combined, drop from an excited state to a ground state, and the OLED display displays an image by using the light.

Accordingly, an OLED display has self-luminance characteristics, and unlike a liquid crystal display (LCD), the OLED display's thickness and weight thereof can be reduced since a separate light source is not required. Further, because OLED displays have high quality characteristics, such as low power consumption, high luminance, and high reaction speed, OLED displays are more appropriate for use in mobile electronic devices.

In general, the hole injection electrode, the electron injection electrode, and other metal wires of the OLED display may reflect external light. When the OLED display is used in a bright place, expression of black color and contrast are deteriorated due to reflection of external light, thereby deteriorating visibility of the OLED display.

The above information disclosed in this Background section is only for enhancement of understanding of the background of the invention, and therefore may contain information that does not form the prior art that is already known in this country to a person of ordinary skill in the art.

SUMMARY OF THE INVENTION

The present invention provides an organic light emitting diode (OLED) display having improved visibility.

An exemplary pixel of an OLED display according to an embodiment of the present invention includes: a thin film transistor (TFT) including a gate electrode, a source electrode, and a drain electrode; a planarization layer on the TFT and including a contact hole at least partially exposing the drain electrode; a pixel electrode on the planarization layer and coupled to the drain electrode of the TFT through the contact hole; and an organic emission layer on the pixel electrode. The pixel electrode includes a corner-cube pattern facing the organic emission layer.

The corner-cube pattern may include a plurality of trihedrons protruding toward the organic emission layer.

The pixel may further include a pixel defining layer on the planarization layer and having an opening that exposes the pixel electrode, and an encapsulation substrate covering the organic emission layer and the pixel defining layer, and the encapsulation substrate may include an auxiliary corner-cube pattern facing the pixel defining layer.

The auxiliary corner-cube pattern may be located at areas corresponding to the pixel defining layer, and may include a plurality of trihedrons protruding toward the pixel defining layer.

The pixel may further include a gap including a gas between the pixel defining layer and the encapsulation substrate and in contact with the auxiliary corner-cube pattern, and the encapsulation substrate may have a refractive index greater than a refractive index of the gas.

The pixel may further include a filler between the pixel defining layer and the encapsulation substrate and in contact with the auxiliary corner-cube pattern, and the filler may have a refractive index lower than a refractive index of the encapsulation substrate.

The corner-cube pattern and the auxiliary corner-cube pattern may be configured to reflect incident light back in a direction substantially parallel to a direction of the incident light.

The organic emission layer may be configured to display an image by emitting light away from the pixel electrode.

The planarization layer may have a gray or black-based color.

The corner-cube pattern may be configured to reflect incident light back in a direction substantially parallel to a direction of the incident light.

An exemplary OLED display according to an embodiment of the present invention includes a plurality of pixels, each of the plurality of pixels including: a thin film transistor (TFT) including a gate electrode, a source electrode, and a drain electrode; a planarization layer on the TFT and including a contact hole at least partially exposing the drain electrode; a pixel electrode on the planarization layer and coupled to the drain electrode of the TFT through the contact hole; and an organic emission layer on the pixel electrode, wherein the pixel electrode includes a corner-cube pattern facing the organic emission layer.

DETAILED DESCRIPTION OF THE EMBODIMENTS

Figure 1:
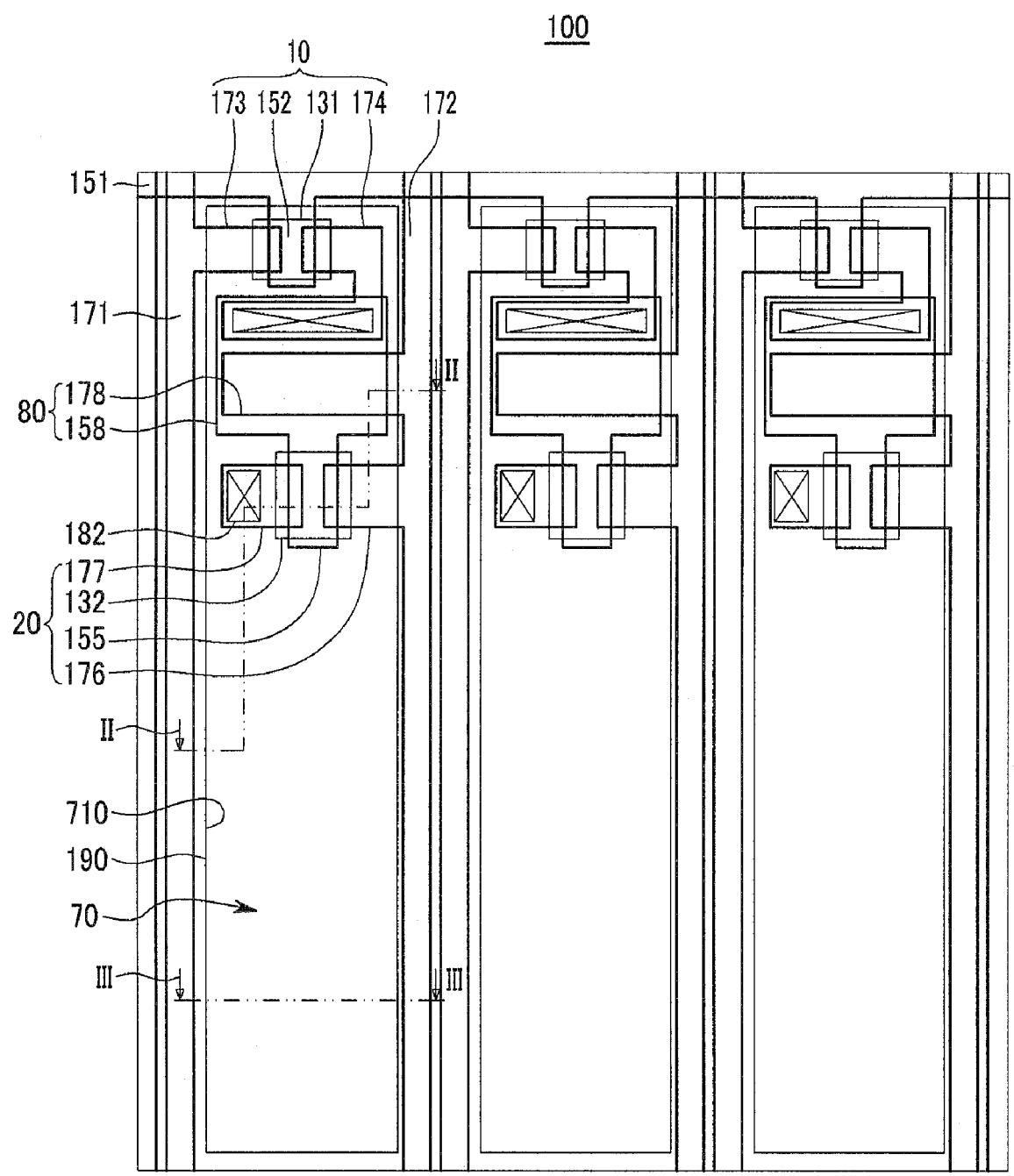
FIG. 1 is a layout view of an organic light emitting diode (OLED) display according to a first exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In addition, the size and thickness of each element in the drawings are samples, for better understanding and ease of description, and the present invention is not limited thereto.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element, or one or more intervening elements may also be present.

Therefore, the drawings and description are to be regarded as illustrative in nature and not restrictive.

In the several exemplary embodiments, constituent elements having the same configuration are representatively described in a first exemplary embodiment by designating like constituent elements thereto, and other exemplary embodiments may be described more specifically regarding differences from the first exemplary embodiment.

In addition, in the accompanying drawings, an organic light emitting diode (OLED) display is illustrated as an active matrix (AM)-type OLED display in a 2Tr-1 Cap structure in which two thin film transistors (TFTs) and one capacitor are formed in one pixel, but the present invention is not limited thereto. Therefore, the OLED display may have various different structures. For example, three or more TFTs and/or two or more capacitors may be provided in one pixel of the OLED display, and separate wires may further be provided in the OLED display. Here, the pixel refers to a minimum unit for displaying an image, and the OLED display generally displays an image by using a plurality of pixels.

Hereinafter, a first exemplary embodiment of the present invention will be described in further detail with reference to FIG. 1 and FIG. 2.

Figure 2:
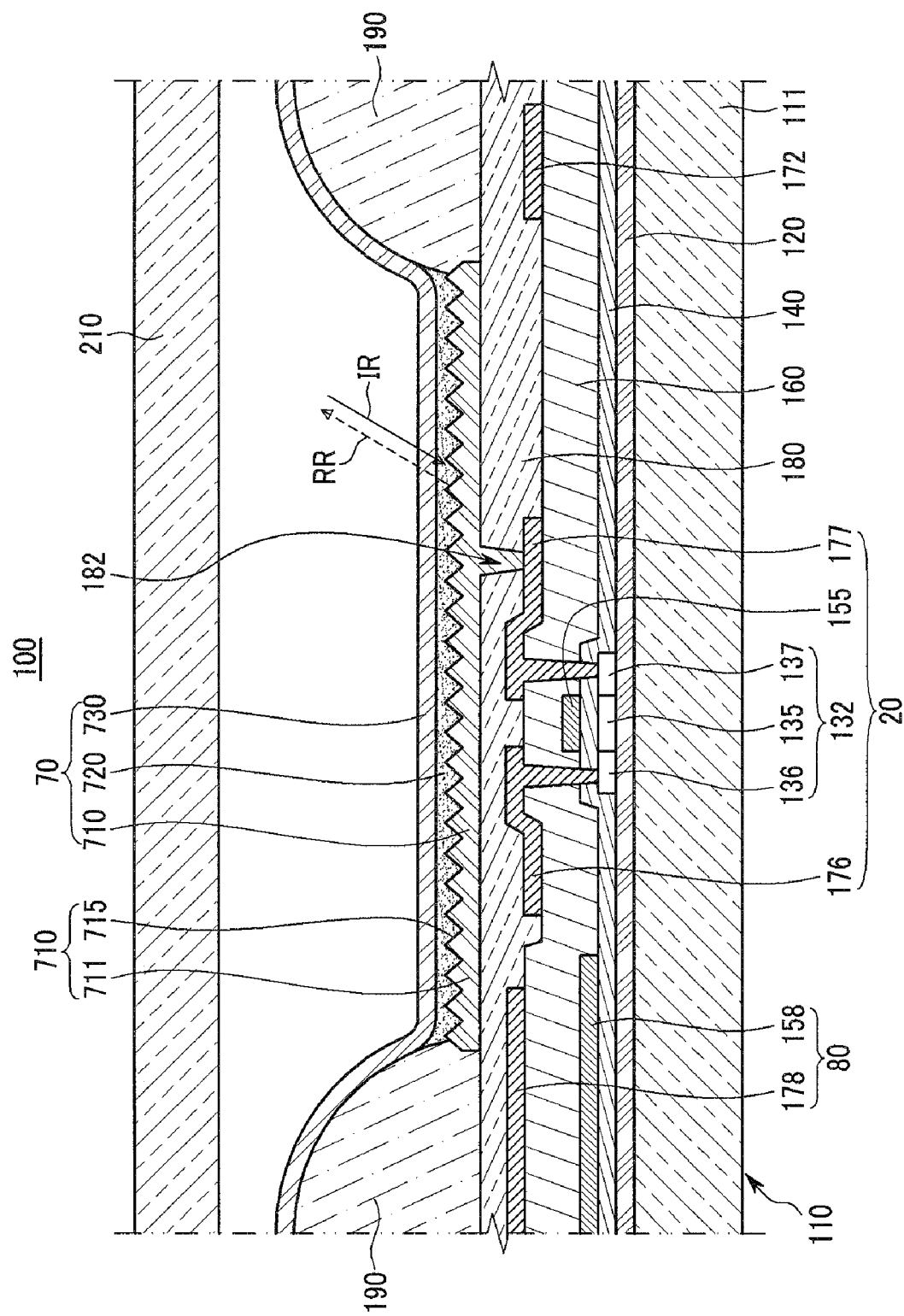
FIG. 2 is a cross-sectional view of FIG. 1, taken along the line II-II.

As shown in FIG. 1 and FIG. 2, an organic light emitting diode (OLED) display 100 includes a display substrate 110 and an encapsulation substrate 210. FIG. 1 is a layout view of a pixel structure, focusing on the display substrate 110. FIG. 2 is a cross-sectional view of the display substrate 110 and the encapsulation substrate 210 of FIG. 1, taken along the line II-II.

The display substrate 110 includes a switching thin film transistor 10, a driving thin film transistor 20, a capacitor 80, and an OLED 70 for each pixel. In addition, the first substrate 110 further includes gate lines 151 disposed along one direction, and data lines 171 and common power lines 172 that respectively cross the gate lines 151, and are insulated therefrom. Here, one pixel may be defined by a boundary including gate lines 151, a data line 171, and a common power line 172, but may not be limited thereto.

The OLED 70 includes a pixel electrode 710, an organic emission layer 720 formed on the pixel electrode 710, and a common electrode 730 formed on the organic emission layer 720. Here, the pixel electrode 710 is a positive (+) electrode which is a hole injection electrode, and the transflective common electrode 730 is a negative (−) electrode which is an electron injection electrode. However, the present invention is not limited thereto, and thus the pixel electrode 710 may be the negative electrode and the common electrode 730 may be the positive electrode according to an alternate driving method of the OLED display 100. Holes and electrons are respectively injected from the pixel electrode 710 and the common electrode 730 into the organic emission layer 720, and form excitons. When the excitons change from an excited state to a base state, light is emitted.

In addition, in the OLED display 100 according to the first exemplary embodiment of the present invention, the OLED 70 displays an image by emitting light away from the pixel electrode 710 (that is, toward the common electrode 730) from the organic emission layer 720. That is, the OLED display 100 is formed as a top light emitting type.

The switching thin film transistor 10 includes a switching semiconductor layer 131, a switching gate electrode 152, a switching source electrode 173, and a switching drain electrode 174, and the driving thin film transistor 20 includes a driving semiconductor layer 132, a driving gate electrode 155, a driving source electrode 176, and a driving drain electrode 177.

The capacitor 80 includes a first capacitive plate 158 and a second capacitive plate 178 with an interlayer insulation layer 160 interposed therebetween. Here, the interlayer insulation layer 160 may include a dielectric material. Capacitance of the capacitor 80 is determined by charges charged in the capacitor 80, that is, a voltage difference between the first and second capacitive plates 158 and 178.

The switching thin film transistor 10 is used as a switch for selecting a pixel to be light-emitted. The switching gate electrode 152 is connected to the gate line 151. The switching source electrode 173 is connected to the data line 171. The switching drain electrode 174 is disposed at a distance from the switching source electrode 173 and is connected to the first capacitive plate 158.

The driving thin film transistor 20 applies driving power to the pixel electrode 710 for light emission of the organic emission layer 720 of the OLEDs 70 in selected pixels. The driving gate electrode 155 is connected to the first capacitive plate 158. The driving source electrode 176 and the second capacitive plate 178 are respectively connected to the common power line 172. The driving drain electrode 177 is connected to the pixel electrode 710 of the OLED 70 through a contact hole 182.

With the above-described structure, the switching thin film transistor 10 is driven to transmit a data voltage applied to the data line 171 to the driving thin film transistor 20 by a gate voltage applied to the gate line 151. A voltage that corresponds to a voltage difference between a common voltage transmitted from the common power line 172 to the driving thin film transistor 20 and the data voltage transmitted from the switching thin film transistor 10 is stored in the capacitor 80, and a current corresponding to the voltage stored in the capacitor 80 flows to the OLED 70 through the driving thin film transistor 20 so that the OLED 70 emits light.

In addition, the pixel electrode 710 includes a corner-cube pattern 715 formed on a side that faces the organic emission layer 720. That is, the pixel electrode 710 includes an electrode main body 711 and a corner-cube pattern 715 protruding from one side of the electrode main body 711 toward the organic emission layer 720.

The corner-cube pattern 715 may reflect incident light from an external environment back in an opposite direction which is substantially parallel to the incident direction. That is, a direction of incident light IR to the corner-cube pattern 715 of the pixel electrode 710 and a direction of reflected light RR from the corner-cube pattern 715 may be substantially parallel to each other.

In this case, since light reflected from the corner-cube pattern 715 is transmitted toward the outside in the opposite direction to the incident direction, reflection of the external light toward a user who is facing the OLED display 100 is suppressed or reduced.

Therefore, visibility of the OLED display 100 may be improved.

As described, deterioration of visibility of the OLED display 100 due to reflection of external light may be suppressed or reduced by using the corner-cube pattern 715 of the pixel electrode 710.

The encapsulation substrate 210 is arranged opposite to the display substrate 110 and seals the thin film transistors 10 and 20, the capacitor 80, and the OLED 70. In addition, incident light to the pixel electrode 710 from an external environment refers to light that passes through the encapsulation substrate 210 and transmitted to the display substrate 110.

Hereinafter, a structure of the OLED display 100 according to the first exemplary embodiment of the present invention will be described in further detail in a stack order. In addition, a structure of a thin film transistor will be described with reference to the driving thin film transistor 20. Further, details of switching thin film transistor 10 may be described more fully with respect to differences from the driving thin film transistor 20.

First, the display substrate 110 will be described. A first substrate 111 is formed as an insulation substrate made of, for example, glass, quartz, ceramic, plastic, etc. However, the present invention is not limited thereto. Therefore, the first substrate 111 may be formed, for example, as a metal substrate that is made of stainless steel.

A buffer layer 120 is formed on the first substrate. The buffer layer 120 prevents or reduces impurities from permeating and planarizes a surface, and may be made of various materials for performing such functions. For example, at least one of a silicon nitride (SiNx) layer, a silicon dioxide (SiO2) layer, or a silicon oxynitride (SiOxNy) layer may be used as the buffer layer 120. However, the buffer layer 120 is not always necessary, and may be omitted according to type and process conditions of the first substrate 111.

The driving semiconductor is formed on the driving buffer layer 120. The driving semiconductor layer 132 is formed of a polysilicon layer. In addition, the driving semiconductor layer 132 includes a channel region 135 in which impurities are not doped, and a source region 136 and a drain region 137 that are doped with p+ impurities at respective sides of the channel region 135. In this case, a doped ion material is a P-type impurity such as boron (B), and $B_2H_6$ is generally used as the doped ion material. The impurity changes in accordance with the type of thin film transistor.

In the first exemplary embodiment of the present invention, a PMOS-structured thin film transistor using the P-type impurity is used as the driving thin film transistor 20, but is not limited thereto. Therefore, a NMOS-structured thin film transistor or a CMOS-structured thin film transistor both may be used as a driving thin film transistor 20.

In addition, although the driving film transistor 20 of FIG. 2 is a polycrystalline thin film transistor including a polysilicon layer, the switching thin film transistor 10 (not shown in FIG. 2) may be a polycrystalline thin film transistor or an amorphous thin film transistor including an amorphous silicon layer.

The gate insulation layer 140 made of silicon nitride (SiNx) or silicon dioxide (SiO2) is formed on the driving semiconductor layer 132. A gate layer including the driving gate electrode 155 is formed on the gate insulating layer 140. The gate layer further includes the gate line 151, the first capacitive plate 158, and other wires. In addition, the driving gate electrode 155 is formed to overlap at least a part of the driving semiconductor layer 132, and particularly, is formed to overlap the channel region 135.

An interlayer insulation layer 160 that covers the driving gate electrode 155 is formed on the gate insulating layer 140. The gate insulating layer 140 and the interlayer insulating layer 160 share through-holes exposing the source region 136 and the drain region 137 of the driving semiconductor layer 132. Like the gate insulation layer 140, the interlayer insulating layer 160 may be made of silicon nitride (SiNx) or silicon dioxide (SiO2).

A data layer including the driving source electrode 176 and the driving drain electrode 177 is formed on the interlayer insulating layer 160. The data layer further includes the data line 171, the common power line 172, the second capacitive plate 178, and other wires. In addition, the driving source electrode 176 and the driving drain electrode 177 are respectively connected to the source region 136 and the drain region 137 of the driving semiconductor layer 132 through the through-holes respectively formed in the interlayer insulation layer 160 and the gate insulation layer 140.

As described, the driving thin film transistor 20 including the driving semiconductor layer 132, the gate electrode 155, the driving source electrode 176, and the driving drain electrode 177 is formed. A configuration of the driving thin film transistor 20 is not limited to the above-described embodiment, and may be variously modified with a disclosed configuration that can be realized by a person of ordinary skill in the art.

A planarization layer 180 that covers data wires 172, 176, 177, and 178 is formed on the interlayer insulating layer 160. The planarization layer 180 removes steps and performs planarization in order to increase luminous efficiency of the OLED 70. In addition, the planarization layer 180 has a contact hole 182 through which the drain electrode 177 is partially exposed.

The planarization layer 180 may be made of at least one of polyacrylate resin, epoxy resin, phenolic resin, polyamide resin, polyimide resin, unsaturated polyesters resin, poly phenylenether resin, poly phenylenesulfide resin, or benzocyclobutene (BCB).

The first exemplary embodiment of the present invention is not limited to the above-described structure, for example, one of the planarization layer 180 or the interlayer insulating layer 160 may be omitted as necessary.

The pixel electrode 710 of the OLED 70 is formed on the planarization layer 180. That is, in the OLED display 100, a plurality of pixel electrodes 710 are disposed in corresponding pixels. In this case, the plurality of pixel electrodes 710 are respectively disposed at a distance from each other. The pixel electrode 710 is connected to the drain electrode 177 through the contact hole 182 of the planarization layer 180.

Figure 3:
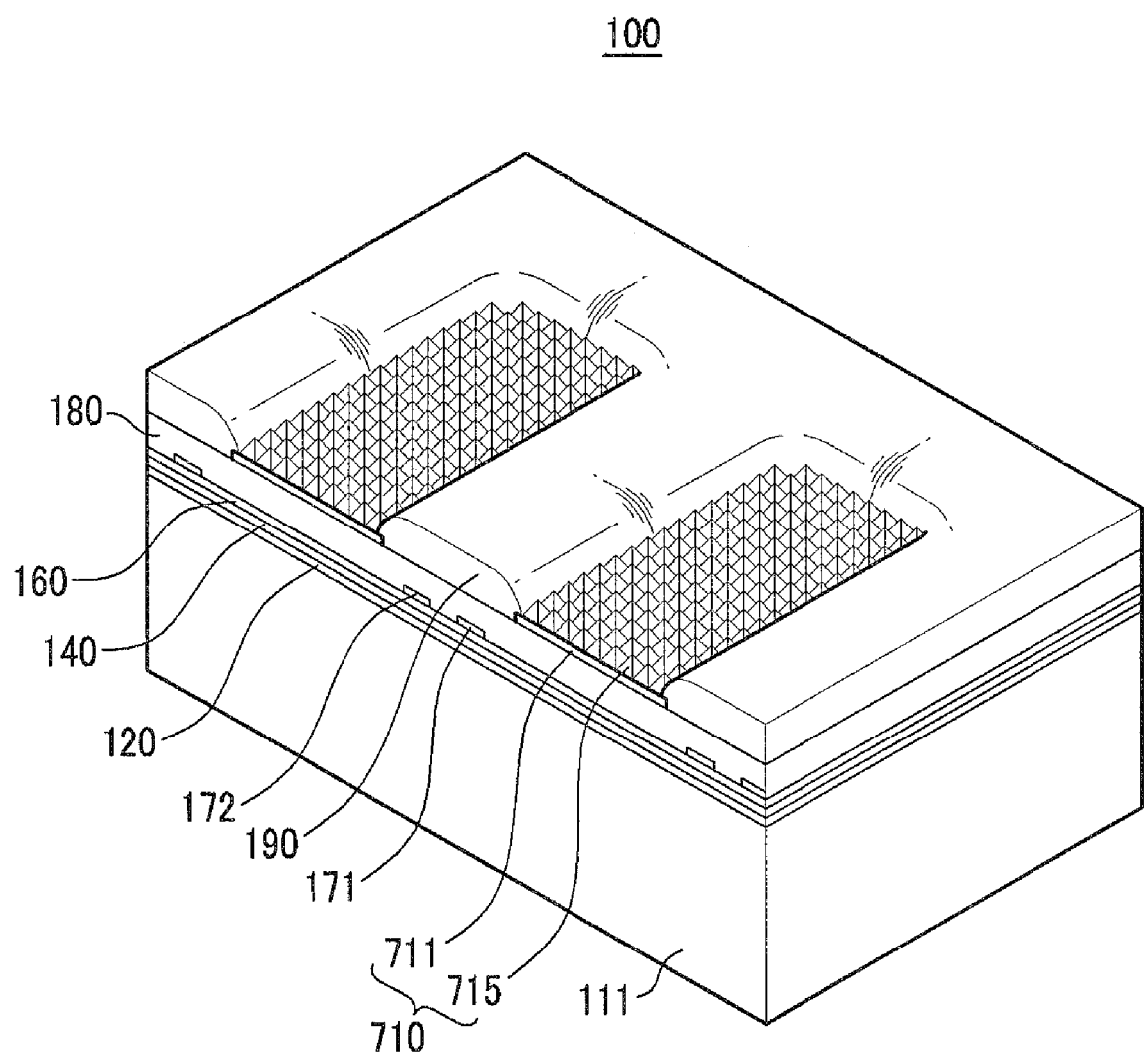
FIG. 3 is a perspective view of FIG. 1, taken along the line III-III.
Figure 4:
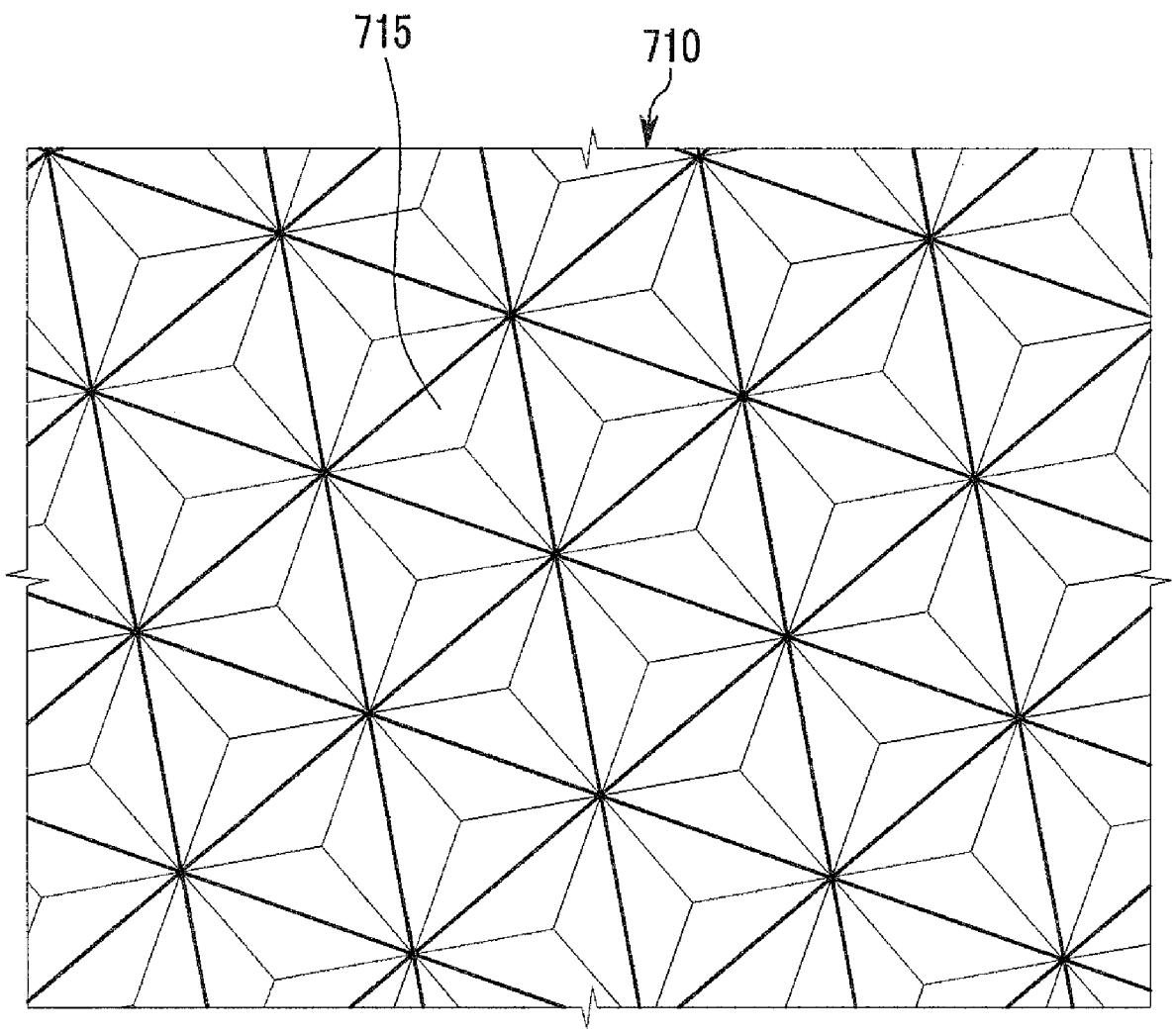
FIG. 4 is an enlarged top-plan view of a corner-cube pattern of FIG. 3.

In addition, the pixel electrode 710 includes an electrode main body 711 and a corner-cube pattern 715 protruding from the electrode main body 711. As shown in FIG. 3 and FIG. 4, the corner-cube pattern 715 may be formed as a plurality of trihedrons. FIG. 3 is a perspective view illustrating the corner-cube pattern 715 as relates to the pixel defining layer 190, and FIG. 4 is a top plan view of the corner-cube pattern 715. In further detail, a corner-cube may be a trihedral structure having unique optical characteristics in that an incident beam or incident light entering the effective aperture is reflected in a direction substantially opposite an incident direction regardless of the incident angle. In other words, the corner-cube is a cube with a cut-off corner, that is, it has a triangular pyramid shape. The corner-cube pattern 715 including the corner-cubes is formed on one side of the electrode main body 711 of the pixel electrode 710.

In addition, the corner-cube pattern 715 may be formed by various known methods. For example, the corner-cube pattern 715 may be formed by performing fine grinding and polishing of a drawn hexagonal stainless pin with a desired size and a desired angle to make a surface roughness of a quarter of a visible ray wavelength. In addition, the corner-cube pattern 715 may be formed by performing laser ablation with an excimer laser.

In addition, a pixel defining layer 190 having an opening that exposes the pixel electrode 710 is formed on the planarization layer 180. That is, the pixel defining layer 190 includes a plurality of openings defining each pixel. In addition, the pixel electrodes 710 correspond to the openings of the pixel defining layer 190, but it is not limited thereto. That is, the pixel electrode 710 may also be disposed under the pixel defining layer 190 to be partially overlapped by the pixel defining layer 190. The pixel defining layer 190 may be made of an inorganic material of a resin or silica group such as polyacrylate resin and polyimide.

The organic emission layer 720 is formed on the pixel electrode 710 to contact the corner-cube pattern 715, and the common electrode 730 is formed on the organic emission layer 720. As described, the OLED 70 including the pixel electrode 710, the organic emission layer 720, and the common electrode 730 is formed.

The organic emission layer 720 is made of either a low-molecular organic material or a high-molecular organic material. The organic emission layer 720 is formed in a multi-layer structure including at least one of a hole injection layer (HIL), a hole transport layer (HTL), an emission layer, an electron transport layer (ETL), or an electron injection layer (EIL). When the organic emission layer 720 is formed in a multi-layer structure including all the layers HIL, HTL, ETL, and EIL, the HIL is formed on the pixel electrode 710 which is a positive electrode and the HTL, ETL, and EIL are sequentially stacked thereon.

In addition, in FIG. 2, the organic emission layer 720 is disposed only in the opening of the pixel defining layer 190 according to the first exemplary embodiment of the present invention, but it is not limited thereto. That is, the organic emission layer 720 may be formed not only on the pixel electrode 190 in the opening of the pixel defining layer 190, but may also extend to between the pixel defining layer 190 and the common electrode 730. In further detail, the organic emission layer 720 may further include several layers including an emission layer, an HIL, an HTL, an ETL, and an EIL. In this case, like the common electrode 730, excluding the emission layer, the HIL, HTL, ETL, and EIL may be formed not only on the pixel electrode 710 but also on the pixel defining layer 190 by using an open mask in a manufacturing process. That is, at least one of the layers included in the organic emission layer 720 may be interposed between the pixel defining layer 190 and the common electrode 730.

Each of the pixel electrode 710 and the common electrode 730 may be made of a transparent conductive material, or a transflective or reflective conductive material. According to materials of the pixel electrode 710 and the common electrode 730, the OLED display 100 may be classified as a top light emitting type, a bottom light emitting type, or a dual-side light emitting type.

The OLED display 100 according to the first exemplary embodiment of the present invention is a top light emitting type of OLED display. That is, the OLED 70 emits light toward the encapsulation substrate 210 to display an image. In addition, the pixel electrode 710 is made of a reflective conductive material.

For the transparent conductive material, indium tin oxide (ITO), indium zinc oxide (IZO), zinc oxide (ZnO), or indium oxide (In2O3) may be used. For the reflective or transflective material, lithium (Li), calcium (Ca), fluorinated lithium/calcium (LiF/Ca), fluorinated lithium/aluminum (LiF/Al), aluminum (Al), silver (Ag), magnesium (Mg), or gold (Au) may be used.

The encapsulation substrate 210 is formed on the common electrode 730. The encapsulation substrate 210 may include a second substrate that is made of a transparent material, such as glass or plastic. Although it is not shown, the encapsulation substrate 210 is bonded to the first substrate 110 by a sealing material formed along an edge of the encapsulation substrate 210 to seal a gap between the substrates 110 and 210.

In the above-described structure, most incident light passed through the encapsulation substrate 210 from the external environment is reflected by the corner-cube pattern 715 of the pixel electrode 710. In this case, the incident light is reflected by the corner-cube pattern 715 back in an opposite direction substantially parallel to an incident direction, and therefore, reflection of the incident light toward the user who is facing the OLED display 100 may be suppressed or reduced. That is, visibility of the OLED display 100 may be improved.

With the above-described configuration, the OLED display 100 may have improved visibility. That is, the OLED display 100 may suppress or reduce deterioration of visibility due to reflection of external light by using the corner-cube pattern 715 of the pixel electrode 710.

Hereinafter, a second exemplary embodiment of the present invention will be described in further detail.

Figure 5:
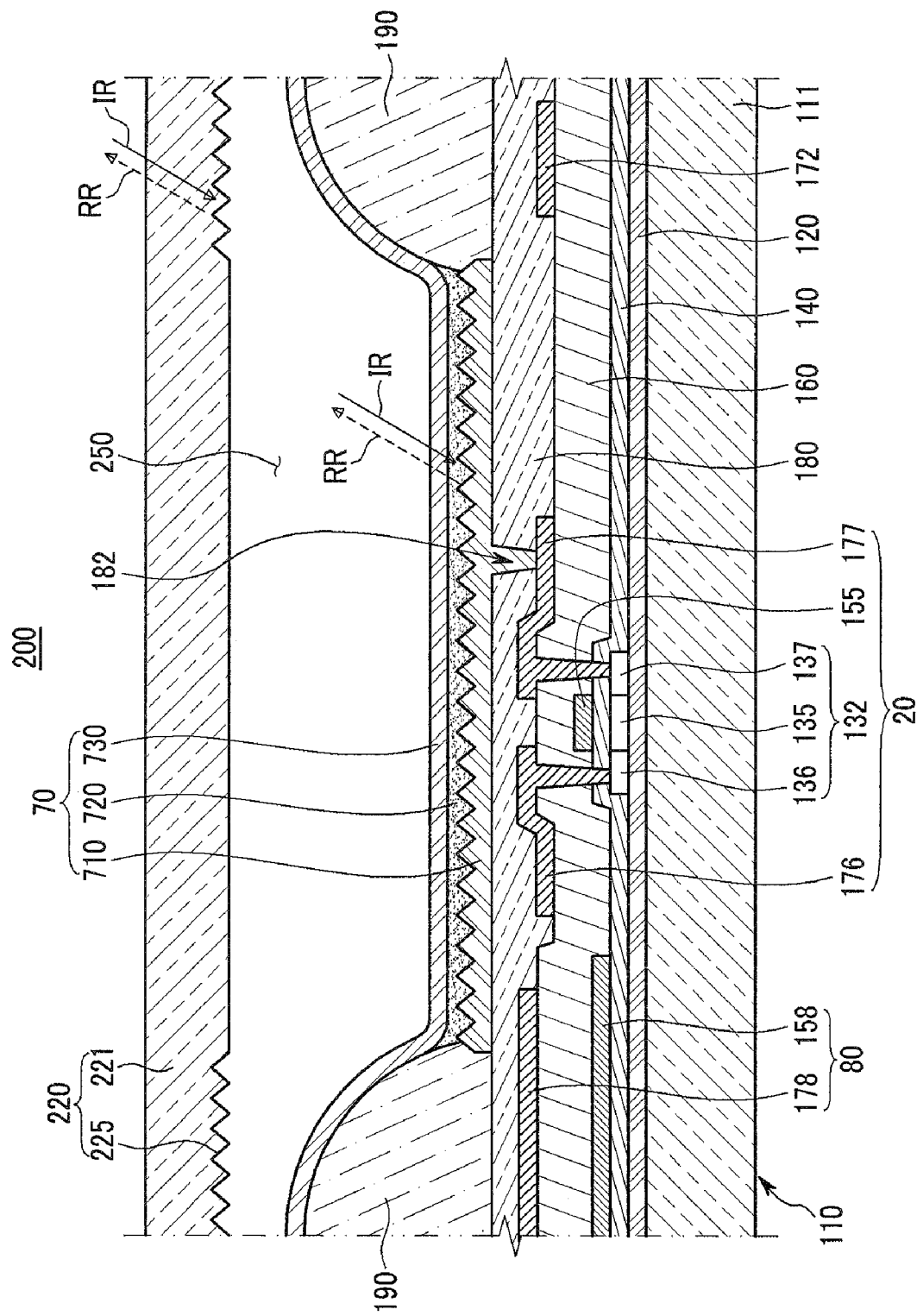
FIG. 5 is a cross-sectional view of an OLED display according to a second exemplary embodiment of the present invention.

As shown in FIG. 5, an encapsulation substrate 220 according to the second exemplary embodiment of the present invention includes a second substrate 221 and an auxiliary corner-cube pattern 225 formed on one side of the second substrate 221. In this case, the auxiliary corner-cube pattern 225 is formed on a surface that faces a pixel defining layer 190. In addition, the auxiliary corner-cube pattern 225 is formed at a location that corresponds to areas including the pixel defining layer 190. That is, the auxiliary corner-cube pattern 225 is not formed at locations that correspond to openings of the pixel defining layer 190.

The corner-cube pattern 715 of the pixel electrode 710 and the auxiliary corner-cube pattern 225 of the encapsulation substrate 220 respectively reflect much of the incident light from the external environment back in an opposite direction substantially parallel to the incident direction. That is, a direction of incident light IR to the corner-cube pattern 715 and the auxiliary corner-cube pattern 225 and a direction of reflected light RR from the corner-cube pattern 715 and the auxiliary corner-cube pattern 225 may be substantially parallel to each other.

In the openings of the pixel defining layer 190, an overlapped area of the pixel electrodes 710 and organic emission layers 720 emit light. Therefore, openings of the pixel defining layer 190 become light emitting areas, and areas where the pixel defining layer 190 is formed become non-light emitting areas.

With the above-described configuration, incident light from the external environment to the light emitting area is reflected in a direction substantially opposite an incident direction by the corner-cube pattern 715 of the pixel electrode 710 so that transmission of the incident light toward a user may be suppressed or reduced. Likewise, incident light from the external environment to the non-light emitting areas is reflected in a direction substantially opposite an incident direction by the auxiliary corner-cube pattern 225 of the encapsulation substrate 220 so that transmission of the incident light toward the user may be suppressed or reduced. Accordingly, visibility of the OLED display 200 may be further improved.

In addition, the encapsulation substrate 220 may be made of a transparent material such as glass. Therefore, the auxiliary corner-cube pattern 225 may also be transparent. As described, in order to make a direction of the incident light of the auxiliary corner-cube pattern 225 substantially parallel to a direction of the reflected light of the auxiliary corner-cube pattern 225, a material having a refractive index that is lower than that of the auxiliary corner-cube pattern 225 (that is, the encapsulation substrate 220) should contact a surface that is opposite an incident light surface of the auxiliary corner-cube pattern 225. According to the second exemplary embodiment of the present invention, an air layer 250, or a gap including air or other suitable gaseous matter, having a refractive index that is lower than that of the encapsulation substrate 220 contacts the auxiliary corner-cube pattern 225. For example, the refractive index of the air layer 250 is 1 and the refractive index of the encapsulation substrate 220 is 1.4~1.5.

Figure 6:
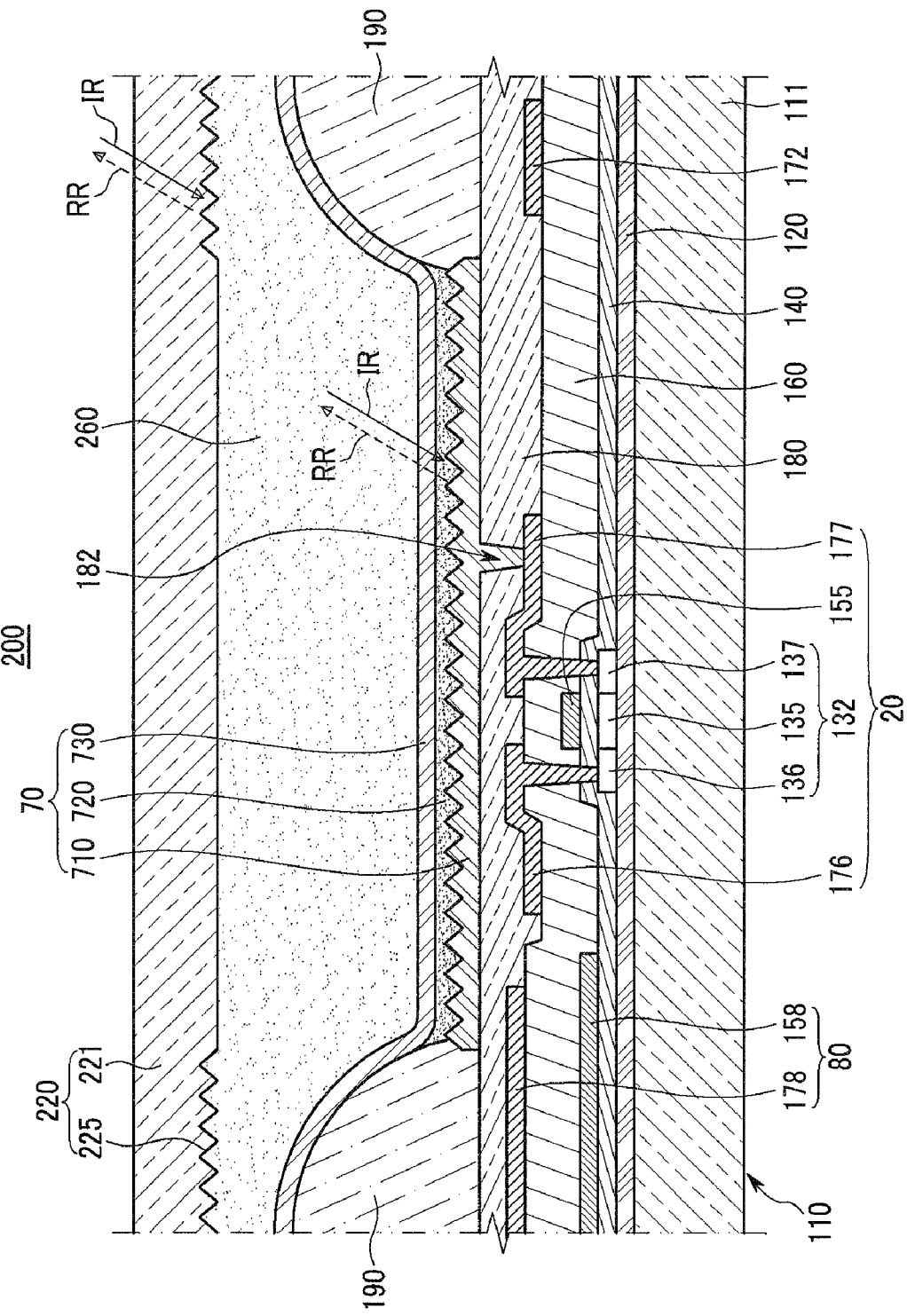
FIG. 6 is a cross-sectional view of an OLED display according to a modified embodiment of the second exemplary embodiment of the present invention.

However, the second exemplary embodiment of the present invention is not limited thereto. Therefore, as shown in FIG. 6, instead of the air layer 250, a filler material 260 may contact the encapsulation substrate 220. That is, the filler material 260, rather than the air layer 250, may be filled between the display substrate 110 and the encapsulation substrate 210. However, like the air layer 250, a refractive index of the filler material 260 should be lower than that of the encapsulation substrate 210. In addition, the filler material 260 may be made of a transparent material.

Hereinafter, a third exemplary embodiment of the present invention will be described with reference to FIG. 7.

Figure 7:
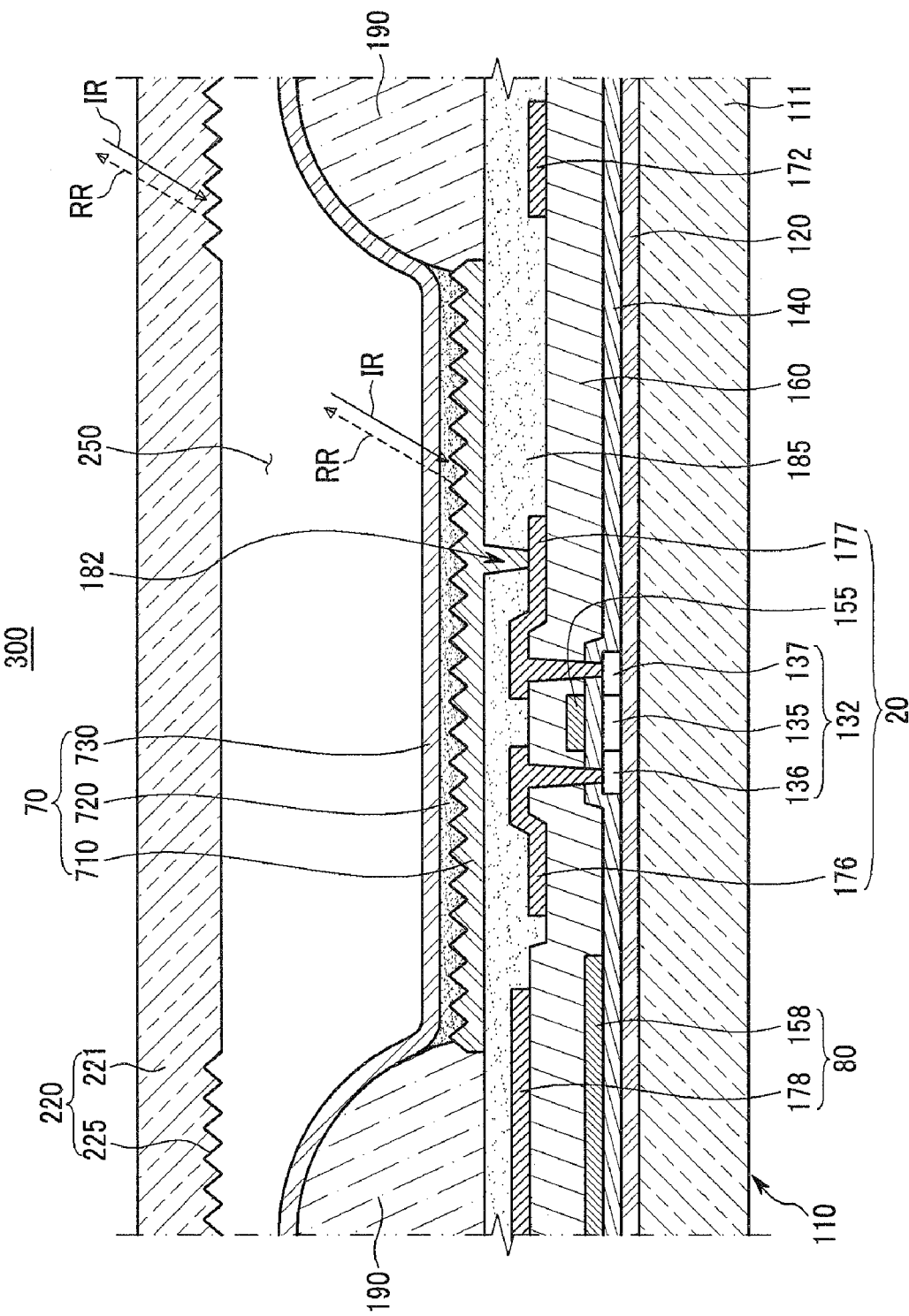
FIG. 7 is a cross-sectional view of an OLED display according to a third exemplary embodiment of the present invention.

As shown in FIG. 7, a planarization layer 185 of an OLED display 300 according to the third exemplary embodiment of the present invention may have a gray or dark color with low brightness. That is, the planarization layer 185 may be made by combining a light absorbing material such as carbon black or titanium oxide with several resin materials having planarization characteristics. Accordingly, the planarization layer 185 may function as a light absorbing layer. Therefore, the planarization layer 185 partially absorbs incident light transmitted through an encapsulation substrate 220 from the external environment so that reflection of the incident light may be further suppressed or reduced.

A corner-cube pattern 715 reflects incident light from the external environment to a pixel electrode 710 back in a direction substantially parallel to an incident direction. That is, a direction of incident light IR to the corner-cube pattern 715 and a direction of reflected light RR from the corner-cube pattern 715 are substantially parallel to each other. In addition, an auxiliary corner-cube pattern 225 functions similarly to the corner-cube pattern 715.

Therefore, visibility of the OLED display 300 may be further improved.

While this invention has been described in connection with what is presently considered to be practical exemplary embodiments, it is to be understood that the invention is not limited to the disclosed embodiments, but is instead intended to cover various modifications and equivalent arrangements included within the spirit and scope of the appended claims.

What is claimed is:

1. A pixel of an organic light emitting diode (OLED) display comprising:
   a thin film transistor (TFT) comprising a gate electrode, a source electrode, and a drain electrode;
   a planarization layer on the TFT and including a contact hole at least partially exposing the drain electrode;
   a pixel electrode on the planarization layer and coupled to the drain electrode of the TFT through the contact hole; and
   an organic emission layer on the pixel electrode,
   wherein the pixel electrode comprises a corner-cube pattern facing the organic emission layer.

2. The pixel of claim 1, wherein the corner-cube pattern comprises a plurality of trihedrons protruding toward the organic emission layer.

3. The pixel of claim 1, further comprising a pixel defining layer on the planarization layer and having an opening that exposes the pixel electrode, and an encapsulation substrate covering the organic emission layer and the pixel defining layer,
   wherein the encapsulation substrate comprises an auxiliary corner-cube pattern facing the pixel defining layer.

4. The pixel of claim 3, wherein the auxiliary corner-cube pattern is located at areas corresponding to the pixel defining layer, and comprises a plurality of trihedrons protruding toward the pixel defining layer.

5. The pixel of claim 4, further comprising a gap including a gas between the pixel defining layer and the encapsulation substrate and in contact with the auxiliary corner-cube pattern,
   wherein the encapsulation substrate has a refractive index greater than a refractive index of the gas.

6. The pixel of claim 4, further comprising a filler between the pixel defining layer and the encapsulation substrate and in contact with the auxiliary corner-cube pattern,
   wherein the filler has a refractive index lower than a refractive index of the encapsulation substrate.

7. The pixel of claim 3, wherein the corner-cube pattern and the auxiliary corner-cube pattern are configured to reflect incident light back in a direction substantially parallel to a direction of the incident light.

8. The pixel of claim 1, wherein the organic emission layer is configured to display an image by emitting light away from the pixel electrode.

9. The pixel of claim 1, wherein the planarization layer has a gray or black-based color.

10. The pixel of claim 1, wherein the corner-cube pattern is configured to reflect incident light back in a direction substantially parallel to a direction of the incident light.

11. An organic light emitting diode (OLED) display comprising a plurality of pixels, each of the plurality of pixels comprising:
    a thin film transistor (TFT) comprising a gate electrode, a source electrode, and a drain electrode;
    a planarization layer on the TFT and including a contact hole at least partially exposing the drain electrode;
    a pixel electrode on the planarization layer and coupled to the drain electrode of the TFT through the contact hole; and
    an organic emission layer on the pixel electrode,
    wherein the pixel electrode comprises a corner-cube pattern facing the organic emission layer.

12. The OLED display of claim 11, wherein the corner-cube pattern comprises a plurality of trihedrons protruding toward the organic emission layer.

13. The OLED display of claim 11, further comprising:
    a pixel defining layer on the planarization layer and having a plurality of openings that expose the pixel electrode of each of the plurality of pixels; and
    an encapsulation substrate covering the organic emission layers of the plurality of pixels and the pixel defining layer,
    wherein the encapsulation substrate comprises an auxiliary corner-cube pattern facing the pixel defining layer.

14. The OLED display of claim 13, wherein the auxiliary corner-cube pattern is located at areas corresponding to the pixel defining layer, and comprises a plurality of trihedrons protruding toward the pixel defining layer.

15. The OLED display of claim 14, further comprising a gap including a gas between the pixel defining layer and the encapsulation substrate and in contact with the auxiliary corner-cube pattern, wherein the encapsulation substrate has a refractive index greater than a refractive index of the gas.

16. The OLED display of claim 14, further comprising a filler between the pixel defining layer and the encapsulation substrate and in contact with the auxiliary corner-cube pattern, wherein the filler has a refractive index lower than a refractive index of the encapsulation substrate.

17. The OLED display of claim 13, wherein the corner-cube pattern and the auxiliary corner-cube pattern are configured to reflect incident light back in a direction substantially parallel to a direction of the incident light.

18. The OLED display of claim 11, wherein the organic emission layer of each of the plurality of pixels is configured to display an image by emitting light away from a corresponding pixel electrode.

19. The OLED display of claim 11, wherein the planarization layer has a gray or black-based color.

20. The OLED display of claim 11, wherein the corner-cube pattern is configured to reflect incident light back in a direction substantially parallel to a direction of the incident light.

* * * * *